United States Patent
Nishimura et al.

(10) Patent No.: US 6,790,286 B2
(45) Date of Patent: Sep. 14, 2004

(54) SUBSTRATE PROCESSING APPARATUS

(75) Inventors: Joichi Nishimura, Kyoto (JP); Masami Ohtani, Kyoto (JP); Kenji Hashinoki, Kyoto (JP); Masayoshi Shiga, Kyoto (JP); Koji Hashimoto, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 0 days.

(21) Appl. No.: 10/047,818

(22) Filed: Jan. 15, 2002

(65) Prior Publication Data

US 2002/0092368 A1 Jul. 18, 2002

(30) Foreign Application Priority Data

Jan. 18, 2001 (JP) ..................................... P2001-010647
Jul. 18, 2001 (JP) ..................................... P2001-217882

(51) Int. Cl.⁷ ........................ B05C 11/00; C23C 16/00; B65G 49/07
(52) U.S. Cl. ........................ 118/712; 118/52; 118/66; 118/719; 156/345.31; 156/345.32; 156/345.24; 204/298.25; 204/298.35; 414/935; 414/937
(58) Field of Search ........................ 204/298.25, 298.35; 118/52, 66, 712, 719; 156/345.31, 345.32; 414/935, 937, 938

(56) References Cited

U.S. PATENT DOCUMENTS

| | | | | |
|---|---|---|---|---|
| 5,571,325 A | * | 11/1996 | Ueyama et al. | 118/320 |
| 5,639,301 A | * | 6/1997 | Sasada et al. | 118/52 |
| 5,733,096 A | * | 3/1998 | Van Doren et al. | 414/744.3 |
| 5,766,360 A | * | 6/1998 | Sato et al. | 118/666 |
| 5,942,013 A | * | 8/1999 | Akimoto | 29/25.01 |
| 6,099,643 A | * | 8/2000 | Ohtani et al. | 118/52 |
| 6,240,874 B1 | * | 6/2001 | Pike | 118/666 |
| 6,313,903 B1 | * | 11/2001 | Ogata | 355/27 |
| 6,371,713 B1 | | 4/2002 | Nishimura et al. | |
| 6,379,056 B1 | * | 4/2002 | Ueda | 396/611 |
| 6,439,822 B1 | * | 8/2002 | Kimura et al. | 414/331.04 |
| 6,471,422 B1 | * | 10/2002 | Ueda et al. | 396/611 |
| 6,503,365 B1 | * | 1/2003 | Kim et al. | 156/345.32 |
| 6,511,315 B2 | * | 1/2003 | Hashimoto | 432/121 |
| 2002/0189758 A1 | * | 12/2002 | Shiga et al. | 156/345.31 |

FOREIGN PATENT DOCUMENTS

| | | |
|---|---|---|
| JP | 635523 | 1/1988 |
| JP | 10284568 | 10/1998 |
| JP | 11186358 | 7/1999 |

* cited by examiner

Primary Examiner—Parviz Hassanzadeh
Assistant Examiner—Karla Moore
(74) Attorney, Agent, or Firm—Ostrolenk, Faber, Gerb & Soffen, LLP

(57) ABSTRACT

Substrate processing parts are stacked and arranged in a multistage manner around a transport robot arranged at the center of a processing area. Rotary application units are arranged on a second layer through an indexer and the transport robot. Rotary developing units are stacked above the rotary application units respectively on a fourth layer located above the second layer. Multistage thermal processing units and an edge exposure unit are horizontally arranged in line above the indexer. In place of the processing units, inspection units performing a macro defect inspection and pattern line width measurement may be arranged in the upside region of the indexer space.

15 Claims, 14 Drawing Sheets

F I G . 1
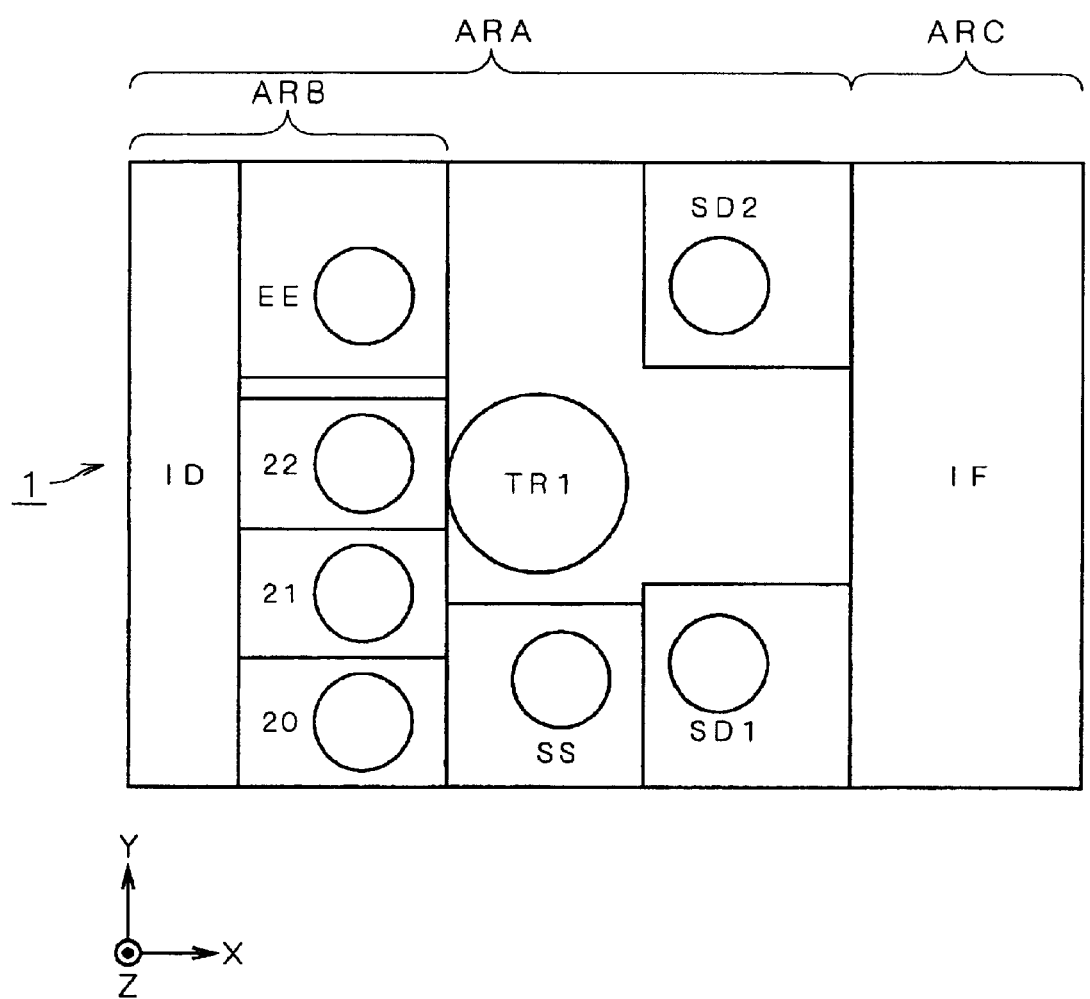

SUBSTRATE PROCESSING APPARATUS

BACKGROUND OF THE INVENTION

1. Field of the Invention

The present invention relates to a substrate processing apparatus performing a series of processing such as thermal processing, chemical processing and the like on a thin-plate substrate (hereinafter simply referred to as "substrate") such as a semiconductor substrate or a glass substrate for a liquid crystal display.

The present invention also relates to a substrate processing apparatus having a built-in inspection part for performing a prescribed inspection such as measurement of the thickness of a resist film, for example, on a substrate.

2. Description of the Background Art

A substrate processing apparatus is employed for performing various processing on a substrate such as a semiconductor wafer, a glass substrate for a liquid crystal display, a glass substrate for a photomask or a glass substrate for an optical disk. In a process for manufacturing a semiconductor device, for example, a substrate processing apparatus formed by unitizing the respective ones of a series of processing and integrating a plurality of processing units with each other is employed.

In the substrate processing apparatus, a transport robot transports the substrate between a heating part for heating on the substrate, a cooling part for cooling the substrate and a chemical processing part for applying chemical processing to the substrate, and the series of substrate processing are performed in prescribed order. Such a substrate processing apparatus is generally set in a clean room managed in temperature, humidity and particles.

FIG. 7 is a conceptual plan view typically showing exemplary arrangement of processing units in a conventional substrate processing apparatus. The substrate processing apparatus shown in FIG. 7 has processing parts 110 and 120 and a transport area 130. A rotary application unit (spin coater) 111 applying a processing liquid to substrates and a rotary developing unit (spin developer) 112 developing the selectively exposed resist on the substrates are arranged on the processing part 110 in parallel with each other.

A plurality of stages of heating units (hot plates) HP and cooling units (cooling plates) CP for heating and cooling the substrates respectively are arranged on the processing part 120. A transport unit 131 for transferring the substrates is provided on the transport area 130. An introduction/discharge apparatus (indexer) 140 adapted to introduce, store and discharge substrates W is arranged on single sides of the processing parts 110 and 120 and the transport area 130.

The introduction/discharge apparatus 140 comprises a plurality of cassettes 141 storing the substrates W and a transfer robot 142 introducing and discharging the substrates W. The transfer robot 142 of the introduction/discharge apparatus 140 moves along arrow U, takes out the substrates W from the cassettes 141 for transferring the same to a transport unit 131, and receives the substrates W having been subjected to the series of processing from the transport unit 131 for returning the same to the cassettes 141. The transport unit 131 transports the substrates W along arrow S in the transport area 130, introduces/discharges the substrates W into/from the aforementioned respective processing units, and transfers/receives the substrates W to/from the transfer robot 142.

The diameters of substrates are recently increasingly enlarged for improving productivity, such that substrates having diameters exceeding 300 mm are also in the process of handling. If the substrates are increased in size, the processing parts for processing the same are also increased in size, to result in size increase of the overall substrate processing apparatus as well as the occupation area (hereinafter referred to as "footprint") occupied by the substrate processing apparatus in plane. In consideration of management of the clean room, however, such size increase of the substrate processing apparatus is unpreferable.

This is because the environmental maintenance cost is increased when the footprint of the substrate processing apparatus is increased. Specific equipment such as a hygrothermal control unit or a filter is required in order to retain a clean internal atmosphere of the substrate processing apparatus for maintaining the clean room. Thus, the material cost and the maintenance cost for the filter or the like are disadvantageously increased. In particular, a high-priced chemical filter for coping with chemically amplified resist or the like may recently be required as a processing solution, and hence the material cost and the maintenance cost are remarkably increased if the area for using the chemical filter is increased.

Further, a single substrate processing apparatus recently contains a number of processing units for efficiently processing a large number of substrates. Therefore, a substrate processing apparatus allowing effective use of a space in the clean room is awaited. In order to suppress increase of the footprint of the substrate processing apparatus, therefore, a substrate processing apparatus formed by stacking the aforementioned processing units upward in a multistage manner is proposed and now in the process of usage. Consequently, the footprint is reduced.

For example, a conventional substrate processing apparatus formed by vertically arranging all of an introduction/discharge apparatus and respective processing units is proposed. Further, another conventional substrate processing apparatus formed by stacking respective processing units in a processing part is proposed.

In such a substrate processing apparatus formed by stacking respective processing units in a multistage manner, the height is increased in response to the degree of stacking, although increase of the footprint can be suppressed. As the height of the substrate processing apparatus is increased, the height of a transport robot transporting substrates to the respective processing parts is also increased, leading to unstable substrate transportation. Therefore, the stacking is limited.

On the other hand, as is well known, a product such as a semiconductor device or a liquid crystal display is manufactured by performing a series of processing such as cleaning, application of resist, exposure, development, etching, formation of an interlayer isolation film, thermal processing, dicing and the like on the aforementioned substrate. In order to maintain the quality of such a semiconductor product, it is important to inspect the substrate after a collective process of the aforementioned processing for confirming the quality thereof.

For example, a substrate processing apparatus such as a coater and a developer performing application of resist and development generally performs an inspection such as line width measurement of a pattern on the substrate in the final step of development. At this time, the substrate to be inspected is temporarily discharged from the substrate processing apparatus and introduced into a dedicated inspection apparatus to be inspected therein. The result of the inspection is fed back to the substrate processing apparatus, which in turn adjusts various processing conditions.

In the aforementioned conventional method, however, the substrate to be inspected is temporarily discharged from the substrate processing apparatus and introduced into the inspection apparatus provided on another position to be subjected to the inspection, and hence it takes time to complete the inspection. Even if a defective substrate is caused due to a problem in processing conditions, a long time is required to prove the defect by the inspection and substrate processing progresses in bulk under erroneous processing conditions before the result of the inspection is fed back. In this case, it follows that defective substrates are caused in bulk. In particular, the unit cost for the recent substrates of φ300 m is so high that significant loss results when defective substrates are caused in bulk.

Therefore, the assignee of the present invention has proposed a technique capable of quickly feeding back the result of an inspection by connecting a substrate processing apparatus and an inspection apparatus with each other inline and reducing the time required for completing the inspection.

In the aforementioned conventional inline system, however, the inspection apparatus is externally connected to the substrate processing apparatus, and hence the footprint of the apparatus is disadvantageously increased.

In the conventional inline system, further, the inspection apparatus projects outward from the substrate processing apparatus to result in a complicated shape, and it is difficult to arrange a large number of device groups in the clean room. Therefore, a dead space is caused in the clean room to disadvantageously increase the running cost for a reason similar to the above.

SUMMARY OF THE INVENTION

The present invention is directed to an apparatus for processing a substrate. According to the present invention, the apparatus comprising: a) an indexer portion comprising a downside structure comprising a transfer robot for transferring a substrate from/to a carrier capable to hold a plurality of substrates, and an upside structure defined above the downside structure and comprising upside processing sections of different types horizontally separated from each other and operable to apply processing to the substrate; and b) a processing portion comprising an arrangement of processing units for applying a series of processing to the substrate transferred from the transfer robot, and a transport robot for transporting the substrate between the arrangement of processing units.

In a preferred embodiment of the present invention, the transport robot is operable to access to not only the arrangement of processing units but also the upside processing sections.

Preferably, the upside processing sections comprises a first section for applying a first dry-type processing to the substrate, and a second section for applying a second dry-type processing to the substrate.

The first section may be a thermal section including a plurality of thermal processing units, and the second section may be an optical section including an edge exposure unit for exposing an edge of the substrate.

In an aspect of the present invention, an apparatus for processing a substrate, comprising: a) an indexer portion comprising a downside structure comprising a transfer robot for transferring a substrate from/to a carrier capable to hold a plurality of substrates, and an upside structure defined above the downside structure and comprising an inspection section operable to inspect the substrate; and b) a processing portion comprising an arrangement of processing units for applying a series of processing to the substrate transferred from the transfer robot, and a transport robot for transporting the substrate between the arrangement of processing units.

Preferably, a plane area of the upside structure projected onto a horizontal plane is included in a plane area of the downside structure projected onto the horizontal plane.

Preferably, the upside structure is provided in a location out of a range in which the transfer robot moves for transferring substrate between the carrier and the processing portion.

In a preferred embodiment of the present invention, the inspection section includes at least one of: a resist thickness measurement unit for measuring thickness of resist formed on the substrate; a pattern line width measurement unit for measuring line width of lines formed on the substrate; a pattern superposition measurement for measuring superposition of circuit patterns formed on the substrate; and a macro defect inspection for detecting macro defect on the substrate.

Accordingly, an object of the present invention is to provide a substrate processing apparatus reducible in height while attaining reduction of an occupation area.

Another object of the present invention is to provide a substrate processing apparatus having a function capable of inspecting a substrate without increasing the footprint.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view for illustrating a substrate processing apparatus according to a first preferred embodiment of the present invention;

DESCRIPTION OF THE PREFERRED EMBODIMENTS

<First Preferred Embodiment>

Figure 2:
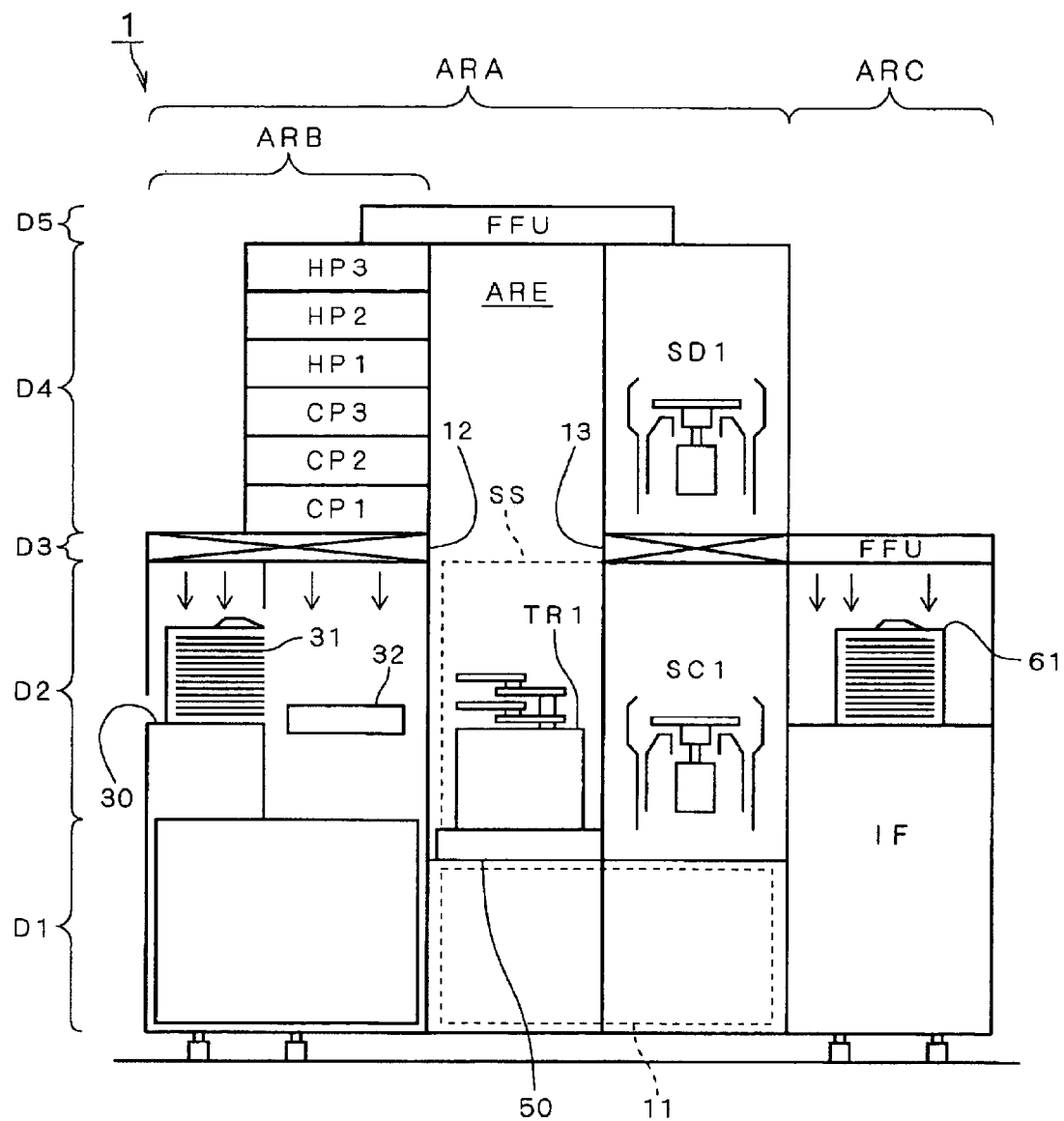
FIG. 2 is a front elevational view for illustrating the substrate processing apparatus according to the first preferred embodiment of the present invention.

FIGS. 1 and 2 illustrate the overall structure of the substrate processing apparatus 1 according to the first preferred embodiment. FIG. 1 is a plan view of the substrate processing apparatus 1, and FIG. 2 is a front elevational view of the apparatus 1. X-Y-Z Cartesian coordinate systems are assigned to FIG. 1, in order to clarify the directional relation thereof. It is assumed that the horizontal plane parallel to the floor face is the X-Y plane, and the vertical direction is the Z-direction.

Referring to FIG. 1, the substrate processing apparatus 1 is roughly classified into a processing area ARA including a substrate introduction/discharge area ARB and a transfer area ARC.

In the processing area ARA, an indexer ID forming the introduction/discharge area ARB for introducing/discharging substrates and a plurality of processing units processing the substrates as described later are radially arranged around a transport robot TR1 serving as substrate transport means transporting the substrates. The transfer area ARC is provided with an interface IF for introducing/discharging the substrates between a stepper (not shown) and the processing area ARA.

In the processing area ARA, various processing units are stacked in five layers D1 to D5. A chemical unit 11 is arranged on the lowermost first layer D1. The chemical unit 11 stores a chemical cabinet having tanks storing various types of processing solutions (chemical solutions) and a waste liquid and pipes, pumps and an exhaust system.

The indexer ID and rotary application units (spin coaters) SC1 and SC2 (see FIG. 3) for applying a processing solution such as photoresist to the substrates while rotating the substrates are arranged on the second layer D2 located on the first layer D1 opposed to the indexer ID across the transport robot TR1, the units SC1 and SC2 serving as processing units for processing the substrates with the processing solution.

Air conditioning units 12 formed by filters such as ULPA (ultra low penetration air) filters or chemical filters and fans are arranged on the third layer D3 located above the indexer ID and the rotary application units SC1 and SC2.

Multistage or three-stage thermal processing units 20, 21 and 22 performing thermal processing on the substrates and an edge exposure unit EE are arranged on the fourth layer D4 located above the indexer ID on the upper surface of the indexer ID in front (a negative direction of the Y-direction) of and at the back (a positive direction of the Y-direction) of the apparatus 1. Rotary developing units (spin developers) SD1 and SD2 developing the substrates after exposure are arranged above the application units SC1 and SC2.

A fan filter unit FFU forming a downflow of clean air is set on the uppermost part of the processing area ARA as the fifth layer D5.

A cleaning unit (spin scrubber) SS for washing or cleaning substrate while supplying a washing solution such as deionized water to the substrates being rotated is arranged between the rotary application unit SC1 and the indexer ID at the front (the negative direction of the Y-direction) of the apparatus 1 as a processing unit.

The processing area ARA is provided on its center with a transport area ARE where the transport robot TR1 vertically moves up to the fan filter unit FFU.

Figure 3:
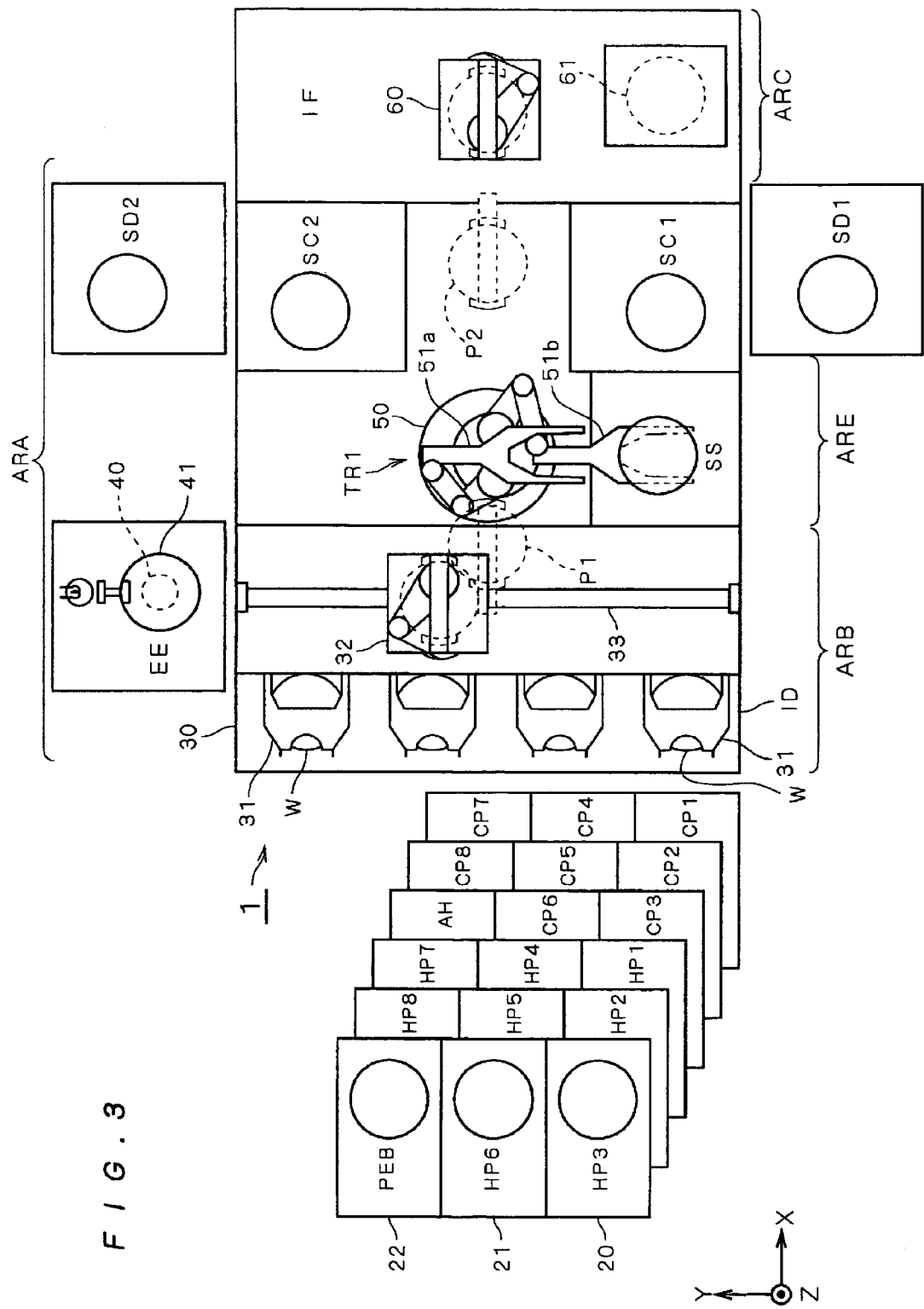
FIG. 3 illustrates the arrangement of processing units forming the apparatus shown in FIG. 1.

Description is now made in further detail with reference to FIG. 3. FIG. 3 illustrates the arrangement structure of the processing units shown in FIG. 1. FIG. 3 further illustrates transportation of substrates W in the processing area ARA, transportation of the substrates W in the indexer ID and transfer of the substrates W between the processing area ARA and the indexer ID.

The indexer ID comprises a plurality of (in this preferred embodiment, four) cassettes 31 storing the substrates W and a transfer robot 32 introducing and discharging the substrates W on a base 30 directed toward the rear part from the front part of the apparatus 1. The transfer robot 32 comprises a driving mechanism 33 of the Y-axis direction formed by a guide rail or the like as a whole, and is reciprocable in the Y-direction on a passage provided on the indexer ID. The transfer robot 32 is vertically movable and rotatable about an axis in the vertical direction.

The transfer robot 32 provided on the indexer ID transfers/receives the substrates W to/from the transport robot TR1. The transfer robot 32 receives the substrates W transported by the transport robot TR1 to a transfer position P1 and stores the same in the cassettes 31, while taking out the substrates W from the cassettes 31, moving the same to the transfer position P1 and transferring the same to the transport robot TR1.

The multistage thermal processing units 20, 21 and 23 of a six-stage structure and the edge exposure unit EE are arranged above the indexer ID. Among these, the first multistage thermal processing unit 20 has a cool plate part CP1 cooling the substrates W provided on the lowermost first stage and cool plate parts CP2 and CP3 similarly provided on the second and third stages respectively. A hot plate part HP1 heating the substrates W is provided on the fourth stage, and hot plate parts HP2 and HP3 are similarly provided on the fifth and sixth stages respectively.

The central second multistage thermal processing unit 21 has cool plate parts CP4 to CP6 provided on the lowermost first stage to the third stage respectively, as well as hot plate parts HP4 to HP6 provided on the fourth to sixth stages respectively.

The third multistage thermal processing unit 22 has cool plate parts CP7 and CP8 provided on the lowermost first stage and the second stage respectively, an adhesion reinforcing part AH performing adhesion reinforcement processing on the substrates W provided on the third stage, and hot plate parts HP7 and HP8 provided on the fourth and fifth stages respectively. A post-exposure baking plate part PEB performing post-exposure baking on the substrates W is provided on the uppermost stage.

Respective processing units in the multistage thermal processing units 20, 21, 22 and the edge exposure unit EE are dry-processing units for applying processing to the substrate W without any liquid.

The edge exposure unit EE comprises a substrate rotation holding mechanism 40 holding the substrates W and rotating the same at a low speed, a light application part 41 applying light to the peripheral edges of the substrates W etc. Photoresist films are removed from the peripheral edges of the edge-exposed substrates W by later development, to thereby prevent the photoresist films from remaining on the peripheral edges of the substrates W and being peeled to disadvantageously result in particles.

The transport robot TR1 is now described. The transport robot TR1 access all the processing units arranged around the robot TR1 and is operable to transfer and receive the substrates W to and from these processing units. The transport robot TR1 is vertically movable and rotatable about a central vertical axis. The transport robot TR1 is set on a base 50, and provided with a horizontal moving mechanism horizontally moving a pair of transport arms 51a and 51b each holding one substrate W, a vertical moving mechanism vertically moving the arms and a rotation driving mechanism rendering the arms rotatable about the center of the base 50. The transport arms 51a and 51b are three-dimensionally movable by these mechanisms. Thus, the transport arms 51a and 51b are vertically moved and swung in the transport area ARE.

The transport arms 51 and 51b linearly move in the horizontal direction while maintaining postures with respect to the processing units respectively. When the transport arms 51a and 51b are alternately extended and retracted, it is possible to take out a processed substrate W from the processing unit located in front of the arm and introduce an unprocessed substrate W into the processing unit.

According to this structure, the transport robot TR1 can hold a substrate W cooled by the cool plate part CP3 in the fourth layer D4 and another substrate W developed in the rotary developing unit SD1, for example, on the arms 51a and 51b of the transport robot TR1 respectively. Then, the transport robot TR1 retract the arms 51a and 51b, thereafter horizontally rotate by 180°, and extend the arms 51a and 51b for simultaneously replacing the two substrates W with each other.

The transport robot TR1 provided on the central portion of the processing area ARA successively transports the substrates W between the aforementioned chemical unit 11 and the thermal processing units 20 to 22 so that a series of prescribed processing can be performed on the substrates W.

The rotary application units SC1 and SC2 are arranged between the transport robot TR1 and the interface IF in front of and at the back of the apparatus 1. Above these rotary application units SC1 and SC2, the rotary developing units (spin developers) SD1 and SD2 developing the exposed substrates W are stacked on the same occupation area respectively. The space between the front and rear stacked processing units functions as a transfer position P2 for transferring the substrates W between the transport robot TR1 and the interface IF.

The interface IF transferring/receiving the substrates W to/from an external device is arranged on the transfer area ARC, and the stepper (not shown) is adjacently arranged as the external device in the preferred embodiment. The interface IF, having a function of temporarily stocking the substrates W for transferring substrates W completely coated with the resist in the processing area ARA to the stepper and receiving exposed substrates W from the stepper, comprises a transport robot 60 transferring/receiving the substrates W to/from the transport robot TR1 and a buffer cassette 61 receiving the substrates W therein.

The transport robot 60, which is formed to be vertically and horizontally movable and rotatable in the vertical direction about respective axes, transfers the substrates W between the stepper and the processing area ARA. A filter fan unit FFU generating a downflow of clean air is set also immediately above the interface IF.

In relation to the interface IF, the substrates W are replaced with each other on the transfer position P2. In other words, the transport robot TR1 moves the substrates W completely subjected to prescribed processing in the processing area ARA to the transfer position P2 and replaces the substrates W with those in the interface IF.

In the preferred embodiment of the present invention, the rotary application units SC1 and SC2, the rotary developing units SD1 and SD2, the cool plate parts CP1 to CP8, the hot plate parts HP1 to HP8, the adhesion reinforcing part AH, the post-exposure baking plate part PEB and the edge exposure unit EE serve as substrate processing parts. Further, the indexer ID serves as introduction/discharge means, while the transport robot TR1 serves as substrate transport means.

Figure 4:
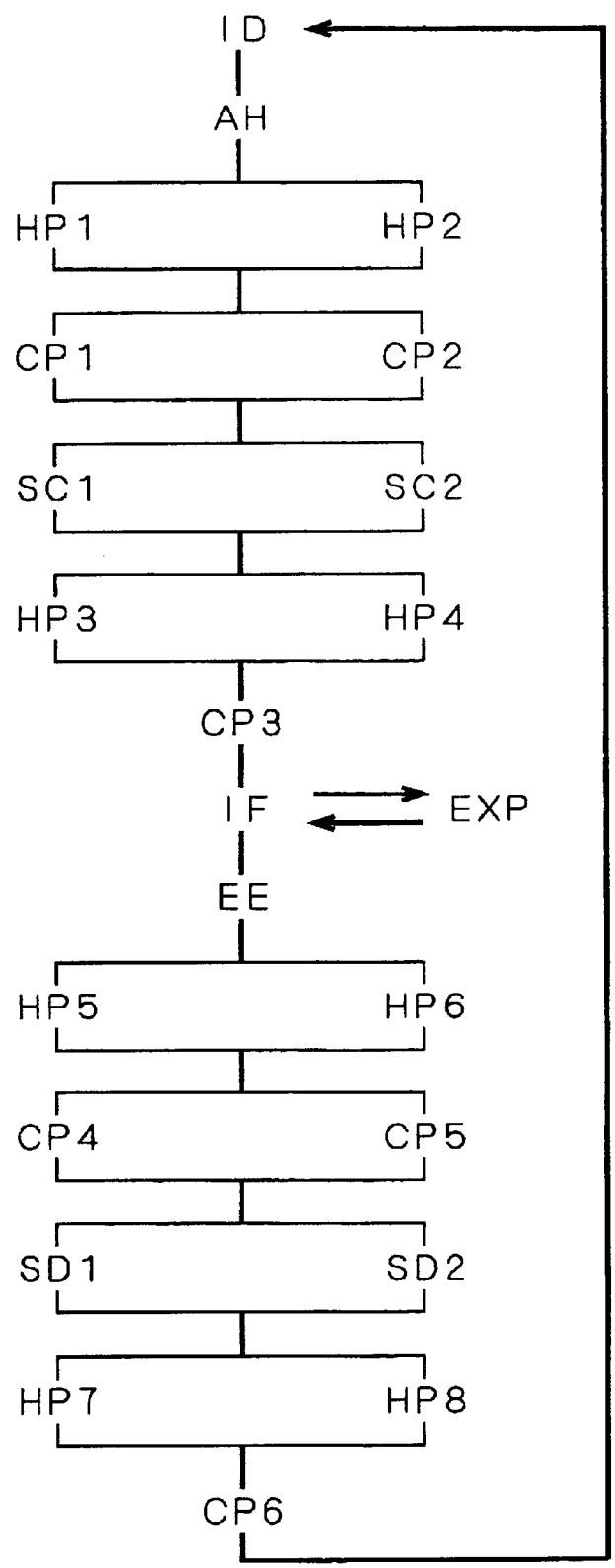
FIG. 4 is a flow chart showing the flow of substrates W to respective processing units etc.

Operations of the substrate processing apparatus 1 shown in FIG. 1 are now described. The flow of the substrate processing apparatus 1 shown in FIG. 1 for processing the substrates W is described with reference to FIG. 4. FIG. 4 is a flow chart showing the flow of the substrates W to the processing units etc. Steps shown with aligned symbols in FIG. 4, such as "SC1, SC2", for example, mean that the substrate W is introduced into vacant one of the rotary application units SC1 and SC2 to be subjected to the process of applying processing liquid in parallel with the same processing to another substrate executed in the other one of the rotary application units SC1 and SC2. The parallel processing is the parallel processing of photoresist application, in this case.

The transfer robot 32 of the indexer ID takes out an unprocessed substrate W from any cassette 31, and introduces this substrate W into the apparatus. The transfer robot TR1 receives the substrate W supplied to the transfer position P1. The transfer robot TR1 successively transports this substrate W to the adhesion reinforcing part AH, the cool plate part CP1 or CP2, the rotary application unit SC1 or SC2, the hot plate part HP1 or HP2, the cool plate part CP3 or CP4 and the edge exposure unit EE.

The cool plate part CP1 or CP2 receives the substrate W to cool the substrate W. When this cooling is terminated, the transport robot TR1 takes out the substrate W from the cool plate part CP1 or CP2 and transfers the same to the rotary application unit SC1. The rotary application unit SC1 applies the processing solution to the received substrate W being rotated. When this processing is terminated, the transfer robot TR1 takes out the substrate W from the rotary application unit SC1 again, horizontally rotates by 180° and transports the substrate W to the hot plate part HP1 or HP2. The hot plate part HP1 or HP2 heats the received substrate W.

The substrate W completely subjected to the aforementioned processing is transferred to the transport robot TR1 again, and transferred to the transport robot 60 through the transfer position P2. The substrate W transferred from the transport robot TR1 to the transport robot 60 is further transferred to the stepper through the interface IF.

The substrate W subjected to exposure of circuit patterns or the like in the stepper is transferred to the transport robot TR1 again through the interface IF. The transport robot TR1 successively transports this substrate W to the edge exposure unit EE, the hot plate part HP5 or HP6, the cool plate part CP4 or CP5, the rotary developing unit SD1 or SD2, the hot plate part HP7 or HP8 and the cool plate part CP6.

In other words, the substrate W completely processed by the external stepper is transferred to the transport robot 60, and supplied to the transfer position P2. Thereafter the transport robot TR1 transfers the substrate W to the rotary developing unit SD1 or SD2 after the exposure unit EE. The rotary developing unit SD1 or SD2 develops the substrate W. The transport robot TR1 transfers the completely developed substrate W to the hot plate part HP7 or HP8, for example, and further transports the same to the cool plate part CP6 for cooling the substrate W.

The completely cooled substrate W is transferred to the transport robot TR1 again, and transferred to the transfer robot 32 through the transfer position P1. Then, the transfer robot 32 returns this substrate W to the cassette 31.

The substrate W subjected to the aforementioned processing is returned to the indexer ID and stored in the cassette 31. Similar processing is thereafter repetitively executed in units of the substrates W.

In the aforementioned substrate processing apparatus 1 according to the first preferred embodiment, the rotary application units SC1 and SC2 and the rotary developing units SD1 and SD2 are stacked, while the multistage thermal processing unit 20 and the edge exposure unit EE are stacked above the indexer ID and arranged on positions opposite to each other through the transfer robot TR1. Therefore, the plane occupation area of the substrate processing apparatus 1 can be reduced as compared with a transport area having a horizontally movable transport unit. Thus, the footprint of the substrate processing apparatus 1 can be reduced. Further, the space above the indexer ID is also utilized for improving planar arrangement efficiency for the processing units and suppressing the height of the substrate processing apparatus 1.

<Second Preferred Embodiment>

Figure 5:
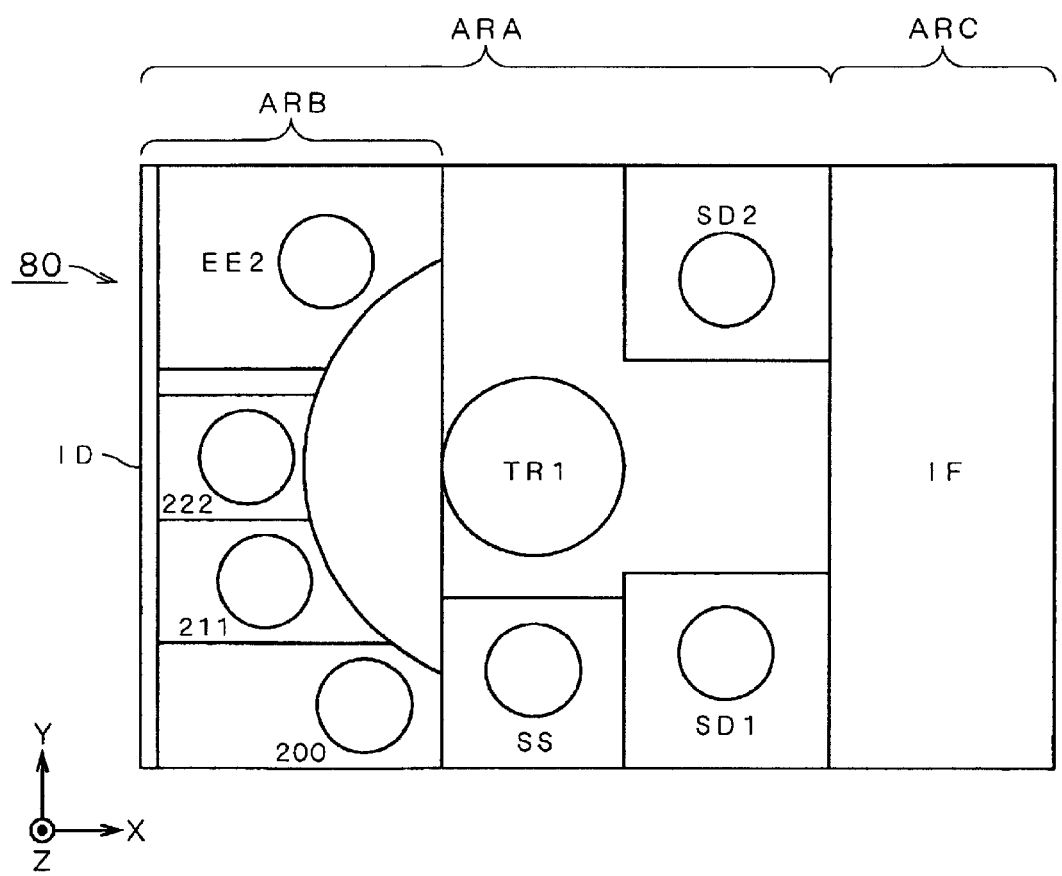
FIG. 5 is a front elevational view for illustrating a substrate processing apparatus according to a second preferred embodiment of the present invention.

FIG. 5 is a plan view schematically showing the structure of a substrate processing apparatus 80 according to a second preferred embodiment of the present invention. Referring to FIG. 5, parts denoted by the same reference numerals as those in FIG. 1 are identical to those in the first preferred embodiment, and hence redundant description is omitted. Characteristic parts of the device according to the second preferred embodiment are now described.

In the substrate processing apparatus 80 according to the second preferred embodiment, units are nonlinearly arranged above an indexer ID on the upper surface of the indexer ID. Rotary developing units SD1 and SD2 are arranged above rotary application units SC1 and SC2, similarly to the apparatus according to the first preferred embodiment.

Multistage thermal processing units 200, 211 and 222 and an edge exposure unit EE2 are arranged around a transport robot TR1 along a rotational or circumferential path enclosing the transport robot TR1. Side surfaces of respective unit rows having introduction openings through which substrates are introduced and taken out are directed toward the transport robot TR1. Thus, the time required for the transport robot TR1 to introduce or take put each substrate into/from each unit is uniformalized.

<Third Preferred Embodiment>

Figure 6:
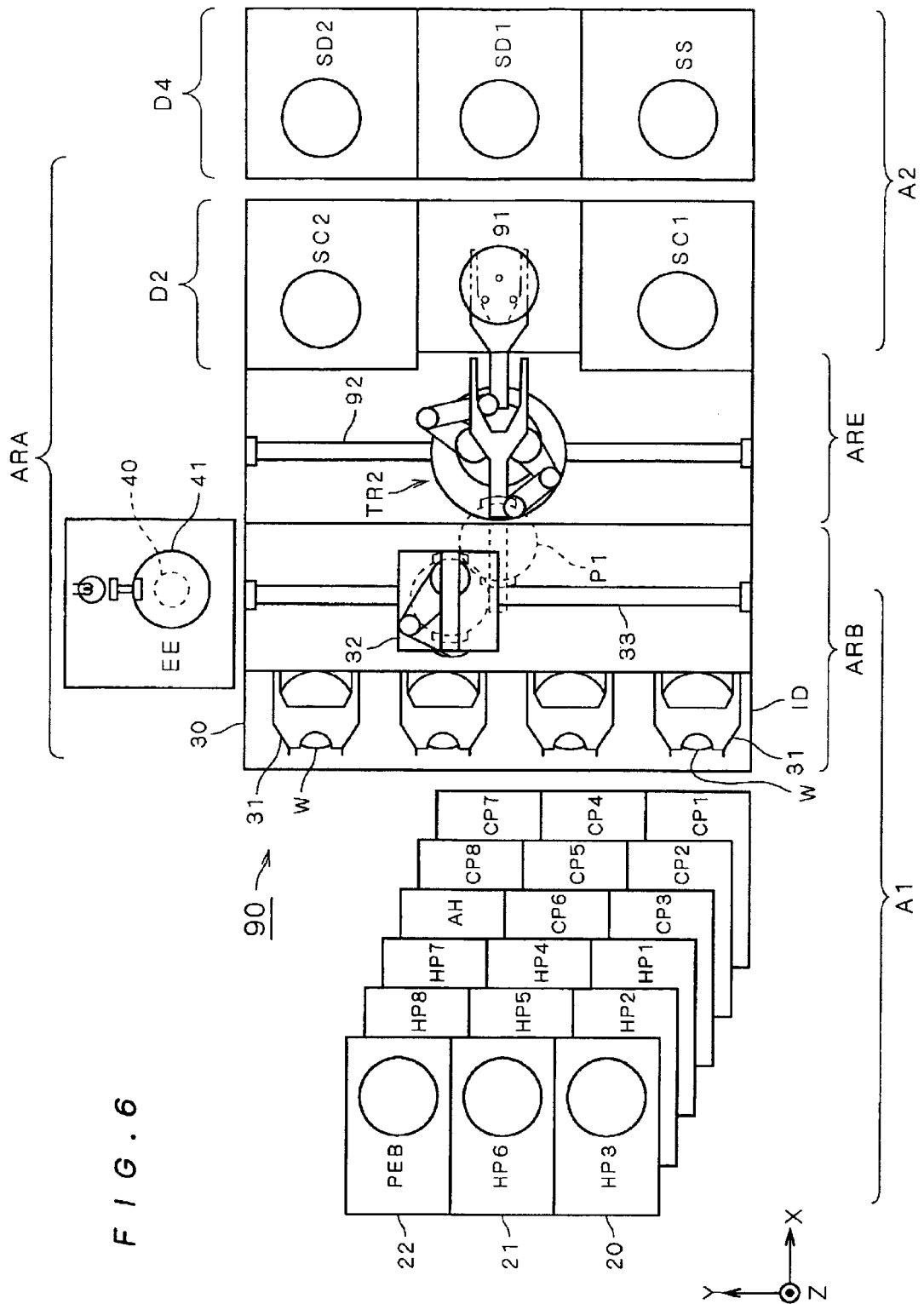
FIG. 6 illustrates the arrangement of processing units forming a substrate processing apparatus according to a third preferred embodiment of the present invention.
Figure 7:
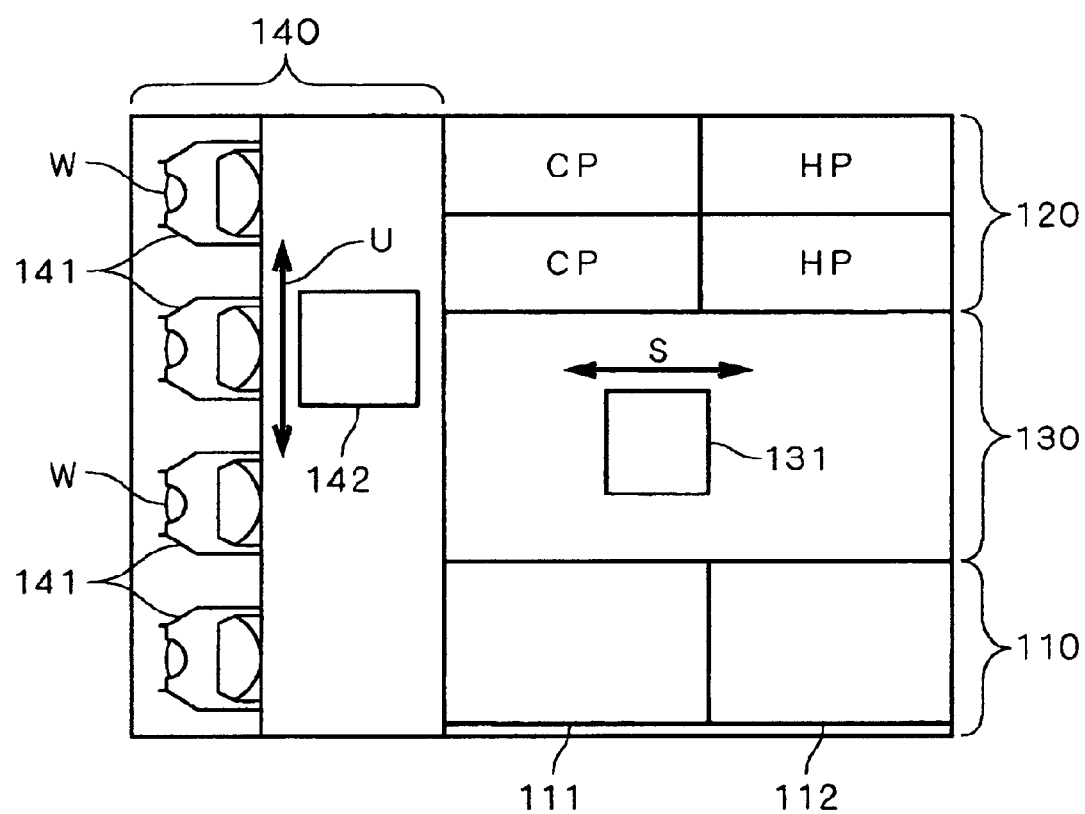
FIG. 7 is a conceptual plan view typically showing the arrangement of processing units in a conventional substrate processing apparatus.

FIG. 6 schematically illustrates the structure of a substrate processing apparatus 90 according to a third preferred embodiment of the present invention. Referring to FIG. 6, parts denoted by the same reference numerals as those in FIG. 1 are identical to those in the first preferred embodiment, and hence redundant description is omitted. Characteristic parts of the device according to the third preferred embodiment are now described.

In the substrate processing apparatus 90, a transport area ARE is arranged at the center of a processing area ARA to partition the processing area ARA. A driving mechanism 92 for a transport robot TR2 is arranged to pass through a substantially central portion of the processing area ARA, for defining the transport area ARE. The transport robot TR2 is formed to only vertically move and horizontally rotate, and the driving mechanism 92 horizontally moves the transport robot TR2 in parallel with an indexer ID.

A first processing unit group A1 formed by arranging the indexer ID, multistage thermal processing units 20 to 22 and an edge exposure unit EE and a second processing unit group A2 formed by rotary application units SC1 and SC2 and rotary developing units SD1 and SD2 are oppositely arranged along the transport area ARE for the transport robot TR2.

The first processing unit group A1 is formed above the indexer ID around a moving path of the transport robot TR2 similarly to the first preferred embodiment.

In the second processing unit group A2, a positioning unit 91 is arranged between the rotary application units SC1 and SC2 in a second layer D2. The positioning unit 91 has a function of adjusting substrates W in a prescribed direction. The rotary application units SC1 and SC2 are arranged on a fourth layer D4 located above the second layer D2 on the inner side of the apparatus 90 while a cleaning unit SS is arranged on the front side. The second processing unit group A2 is formed by the aforementioned stack arrangement.

The transport robot TR2 horizontally moves to introduce and discharge the substrates W into and from the first and second processing unit groups A1 and A2 arranged around the transport area ARE for the transport robot TR2. Thus, the substrate processing apparatus 90 according to this preferred embodiment also effectively utilizes the space above the indexer ID, and the occupation area thereof is reduced similarly to the substrate processing apparatus 1 according to the first preferred embodiment.

The arrangement of the processing units is not restricted to the above but the positioning unit 91 and the edge exposure unit EE or the cleaning unit SS and the positioning unit 91 may alternatively be replaced with each other.

Further, the arrangement of the processing units is not restricted to the above in each of the aforementioned preferred embodiments but the rotary developing units SD1 and SD2 and the rotary application units SC1 and SC2 may alternatively be replaced with each other to be arranged reversely to that shown in FIG. 3.

As clearly understood from the above description, the following advantages are obtained attained according to the respective preferred embodiments of the present invention: Different substrate processing parts are arranged through a space located above introduction/discharge means in the substrate processing apparatus formed by vertically stacking a plurality of processing parts, whereby the space can be suppressed and the occupation area of the apparatus can be reduced in a vertical plane occupied by the substrate processing apparatus.

Figure 8:
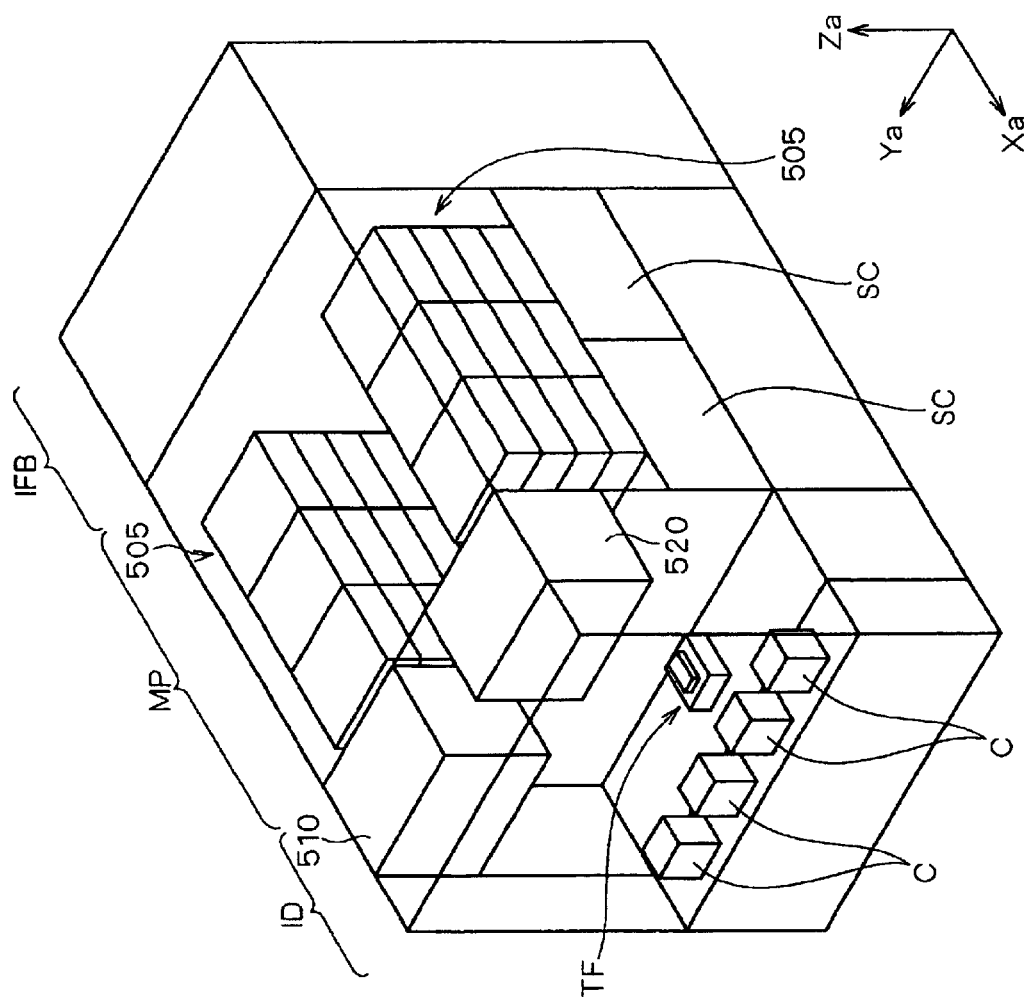
FIG. 8 is a perspective view schematically showing the overall substrate processing apparatus according to another preferred embodiment of the present invention.

FIG. 8 is a perspective view schematically showing the overall substrate processing apparatus according to a fourth preferred embodiment of the present invention. Xa-Ya-Za Cartesian coordinates having the Za-axis direction as the vertical direction and the Xa-Ya plane as the horizontal plane are assigned to FIG. 8 and subsequent drawings at need, in order to clarify the directional relation.

The substrate processing apparatus shown in FIG. 8, the so-called coater & developer performing resist application and development on substrates, is roughly formed by an indexer ID, a unit arrangement part MP and an interface IFB. The indexer ID receives carriers C each capable of storing a plurality of substrates for taking out unprocessed substrates from the carriers C and transferring the same to the unit arrangement part MP, and receives processed substrates from the unit arrangement part MP for storing the same in the carriers C. The indexer ID is described later in further detail.

A plurality of processing units performing prescribed processing on the substrates are arranged on the unit arrangement part MP. In other words, two application units SC are arranged on the front side (−Ya side) of the unit arrangement part MP. The application units SC are the so-called spin coaters dropping photoresist on the main surfaces of the substrates while rotating the same thereby homogeneously applying the resist.

Two developing units (not shown) are arranged on the back side (+Ya side) of the unit arrangement part MP, to be flush with the application units SC. The developing units are the so-called spin developers supplying a developing solution onto exposed substrates thereby developing the same. The application units SC and the developing units are oppositely arranged through a transport path.

A thermal processing unit group 505 is arranged above the two application units SC and the two developing units through a fan filter. The so-called hot plates heating the substrates to a prescribed temperature and the so-called cool plates cooling the substrates to a prescribed temperature while maintaining the substrates at the prescribed temperature are built into the thermal processing unit group 505. The hot plates include a unit performing adhesion reinforcement on the substrates not yet subjected to resist application and a unit baking the exposed substrates. The hot plates and the cool plates are generically referred to as thermal processing units, and the application units SC, the developing units and the thermal processing units are generically referred to as processing units.

A transport robot (not shown) is arranged on the transport path held between the application units SC and the developing units. The transport robot, comprising two transport arms, can apply up- and down-movement to the transport arms, rotate the arms in a horizontal plane and apply expanding and contracting motion in the horizontal plane. Thus, the transport robot can cyclically transfer the substrates between the processing units arranged on the unit arrangement part MP along a prescribed procedure.

The interface IFB has a function of receiving the substrates completely subjected to resist application from the unit arrangement part MP and transferring the substrate to a stepper (not shown) while receiving exposed substrates from the stepper and returning the same to the unit arrangement part MP. In order to implement this function, a transfer robot for transferring and receiving the substrates is arranged on the interface IFB. The interface IFB is also provided with a buffer part temporarily storing the substrates for eliminating the difference between the processing time in the unit arrangement part MP and that in the stepper.

Figure 9:
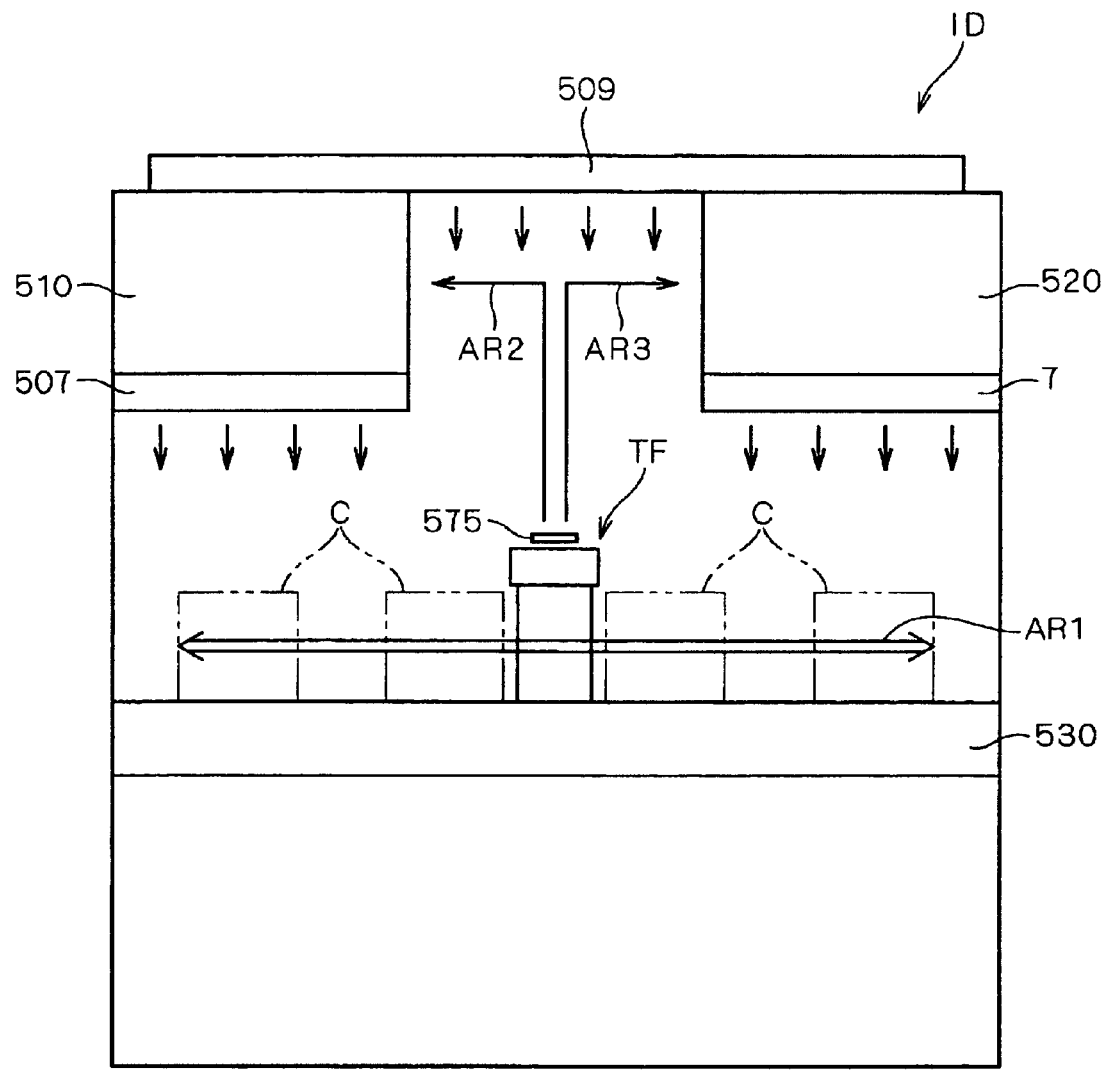
FIG. 9 is a front elevational view showing the structure of a principal part of an indexer.
Figure 10:
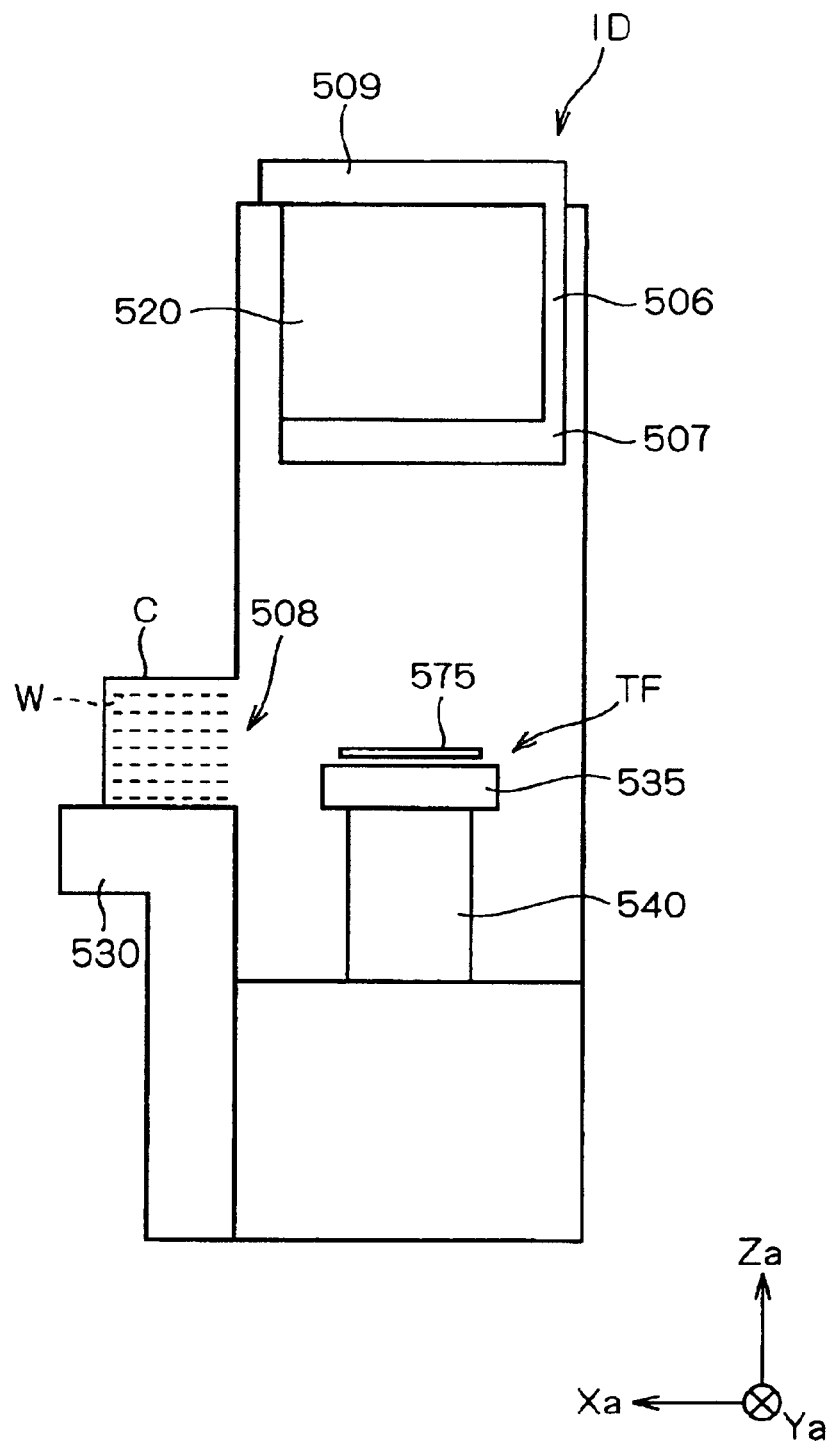
FIG. 10 is a side elevational view of the indexer shown in FIG. 9.

The indexer ID is now described in detail. FIG. 9 is a front elevational view showing the structure of a principal part of the indexer ID, and FIG. 10 is a side elevational view of the indexer ID. The indexer ID mainly comprises a receiving stage 530, a transfer robot TF or transport means and inspection units 510 and 520.

Four carriers C can be arranged and placed on the receiving stage 530 along the horizontal direction (Ya-axis direction). Each carrier C is provided with multistage storage grooves, each of which can store a single substrate W in a horizontal posture with the major surface along the horizontal plane. Therefore, each carrier C can store a plurality of (e.g., twenty five) substrates W stacked in a multistage manner at prescribed intervals in the horizontal posture. While this embodiment employs a FOUP (front opening unified pod) type for the carrier C for storing the substrates W in a closed space, the present invention is not restricted to this but an SMIF (standard mechanical interface) pod type or an OC (open cassette) type exposing stored substrates to the outside air may alternatively be employed.

Each carrier C is provided on the front side (=Xa sides in the figures) with a lid, which is rendered detachable to be capable of introducing and discharging substrates W. A pod opener attaches/detaches the lid to/from the carrier C. When the pod opener detaches the lid from the carrier C, an opening 508 is defined as shown in FIG. 10. The substrates W are introduced and discharged into and from the carrier C through the opening 508. In general, the carrier C is automatically placed on and discharged from the receiving stage 530 with an AGV (automatic guided vehicle) or by OHT (overhead hoist transport).

Figure 11:
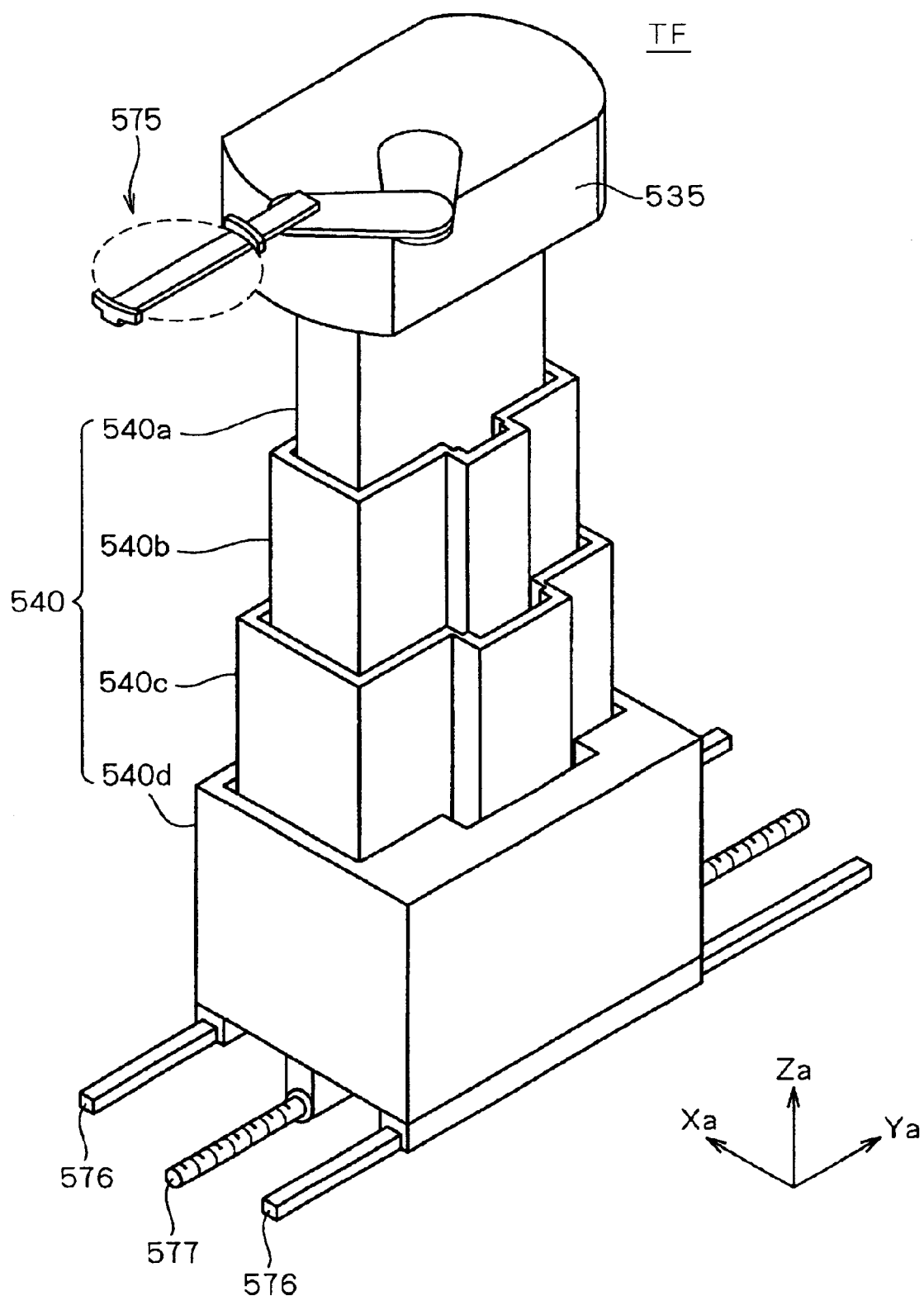
FIG. 11 is a perspective view showing the appearance of a transfer robot.

FIG. 11 is a perspective view showing the appearance of the transfer robot TF. The transfer robot TF, provided with an arm stage 535 comprising a transfer arm 575 on a stretcher 540, implements a telescopic multistage structure with the stretcher 540.

The stretcher 540 is formed by four structure elements 540*a*, 540*b*, 540*c* and 540*d* successively from above. The structure element 540*a* is storable in the structure element 540*b*, which in turn is storable in the structure element 540*c*, which in turn is storable in the structure element 540*d*. The stretcher 540 contracts by successively storing the structure elements 540*a* to 540*d*, and expands by successively drawing out the structure elements 540*a* to 540*d*. In other words, the structure element 540*b* stores the structure element 540*a*, the structure element 540*c* stores the structure element 540*b* and the structure element 540*d* stores the structure element 540*c* when the stretcher 540 contracts. When the stretcher 540 expands, on the other hand, the structure element 540*a* is drawn out from the structure element 540*b*, which in turn is drawn out from the structure element 540*c*, which in turn is drawn out from the structure element 540*d*.

A stretchable hoisting mechanism provided in the stretcher 540 implements the expansion and contraction of the stretcher 540. A mechanism driving a plurality of combinations of belts and rollers with a motor can be employed for the stretchable hoisting mechanism, for example. The transfer robot TF can perform up- and down-movement along the vertical direction (Za-axis direction) of the transfer arm 575 due to the stretchable hoisting mechanism.

As shown in FIG. 11, the transfer arm 575 of the transfer robot TF is movable along the Ya-axis direction due to a Ya driving mechanism, which is a Ya-axis directional driving mechanism formed by an external thread 577, a guide rail 576 etc. The structure element 540*d* fitting with the external thread 577 can be slid along the Ya-axis direction by rotating the external thread 577 with an electric motor.

Further, the transfer robot TF can apply expanding and contracting motion and rotating motion to the transfer arm 575. More specifically, an arm stage 535 provided on the structure element 540*a* applies expanding and contracting motion and rotating motion to the transfer arm 575. In other words, the arm stage 535 bends an arm segment of the transfer arm 575 for applying expanding and contracting motion to the transfer arm 575, while the arm stage 535 itself rotates with respect to the stretcher 540 for rotating the transfer arm 575.

Therefore, the transfer robot TF can apply up- and down-movement to the transfer arm 575 in the vertical direction, horizontally move the same along the Ya-axis direction, rotate the same and horizontally apply expanding and contracting motion thereto in the horizontal direction. In other words, the transfer robot TF can three-dimensionally move the transfer arm 575.

The first role of the transfer robot TF is to take out unprocessed substrates W from the carriers C and transfer the same to the transport robot of the unit arrangement part MP, and to receive unprocessed substrates W from the transport robot of the unit arrangement part MP and store the same in the carriers C. The substrates W are transferred between the transfer robot TF and the aforementioned transport robot on a position substantially flush with the carriers C. When transferring/receiving the substrates W to/from the carriers C and the unit arrangement part MP, therefore, the transfer robot TF moves along a linear path parallel to the direction of the arrangement of the four carriers C and substantially flush with the carriers C, as shown by arrow AR1 in FIG. 9.

The second role of the transfer robot TF according to the fourth preferred embodiment is to receive the substrates W subjected to prescribed processing steps in the unit arrangement part MP from the transport robot and introduce the same into the inspection unit 510 or 520 while discharging inspected substrates W from the inspection unit 510 or 520 and storing the same in the carriers C or transferring the same to the transport robot of the unit arrangement part MP.

The inspection unit 510 in the apparatus according to the forth preferred embodiment is an inspection unit (macro defect inspection unit) performing a macro defect inspection, which is an inspection determining presence/absence of a relatively large defect, such as adhesion of particles, for example, appearing on any substrate W. On the other hand, the inspection unit 520 performs resist thickness measurement, pattern line width measurement and pattern superposition measurement. In other words, the single inspection unit 520 can perform three inspections. The "resist thickness measurement" is an inspection measuring the thickness of a resist film applied onto each substrate W. The "pattern line width measurement" is an inspection measuring the width of lines included in circuit patterns formed on each substrate W by exposure and development. The "pattern superposition measurement" is an inspection measuring relative displacement of the circuit patterns formed on each substrate W by exposure and development.

Both of the inspection units 510 and 520 are arranged in the indexer ID. More correctly, the inspection units 510 and 520 are so arranged that an indexer plane area formed by parallel projection mapping of the indexer ID on a horizontal plane includes inspection part plane areas formed by parallel projection mapping of the inspection units 510 and 520 onto the horizontal plane. This is now described with reference to FIG. 12.

Figure 12:
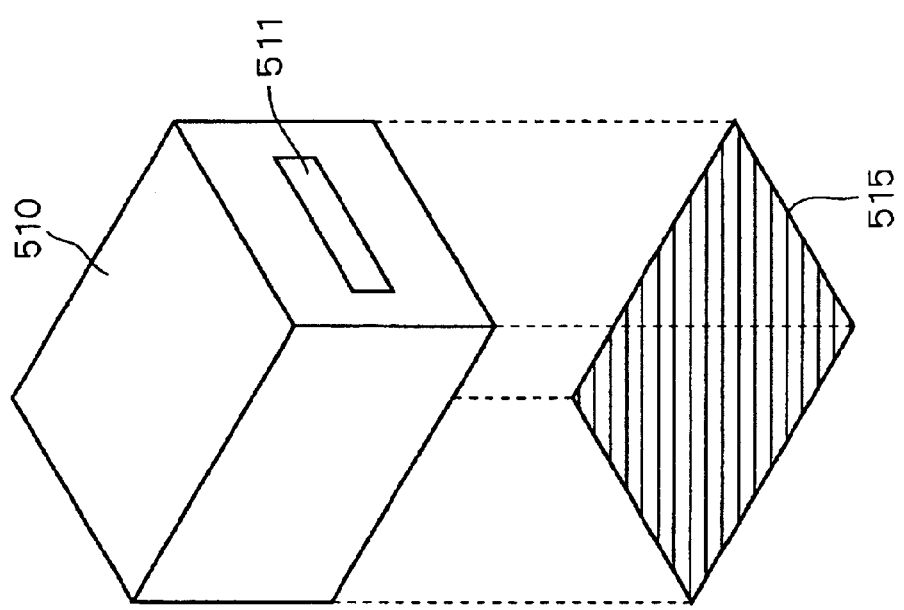
FIG. 12 illustrates an inspection unit and an inspection part plane area thereof.

FIG. 12 illustrates the inspection unit 510 and the inspection part plane area thereof. When the inspection unit 510 having a casing in the form of a rectangular box is projected onto a horizontal plane by parallel projection mapping so that projection lines are parallel to each other, it follows that an inspection part plane area 515 of the inspection unit 510 is drawn on the horizontal plane. When the indexer ID is similarly projected on a horizontal plane by parallel projection mapping, the indexer plane area of the indexer ID is drawn on this horizontal plane. According to this preferred embodiment, the inspection unit 510 is so arranged on the indexer ID that the indexer plane area includes the inspection part plane area 515, and this also applies to the inspection unit 520. Further, the indexer ID completely includes or encloses the inspection units 510 and 520 therein when viewed from above (i. e., viewed along the (-Za) direction).

The inspection units 510 and 520 are provided on positions not interfering with the moving path (the arrow AR1 in FIG. 9) of the transfer robot TF for transferring and receiving the substrates W to and from the carriers C and the unit arrangement part MP. In other words, the moving path is formed to be substantially flush with the carriers C, while the inspection units 510 and 520 are provided on positions higher than the four carriers C, more specifically on both upper corners in the indexer ID.

A fan filter unit 509 is provided on the upper portion of the indexer ID. The fan filter unit 509, storing a blast fan and an ULPA filter, draws air from the clean room and forms a downflow of cleaning air in the indexer ID. According to this preferred embodiment, however, the inspection units 510 and 520 are provided on both upper corners of the indexer ID respectively. When the fan filter unit 509 supplies the downflow of the clean air from above the indexer ID as such, therefore, it follows that no downflow is formed under the inspection units 510 and 520. According to this preferred embodiment, therefore, clean air outlets 507 are provided under the inspection units 510 and 520 respectively, to be communicatively connected with the fan filter unit 509 serving as a clean air source by ducts 506. The ducts 506 are arranged in the indexer ID at the back ((-Xa) side) of the inspection units 510 and 520 respectively.

Thus, the fan filter unit 509 feeds clean air to the clean air outlets 507 through the ducts 506 so that downflows of clean air can be formed from the clean air outlets 507 under the inspection units 510 and 520, as shown in FIG. 9. In the region not provided with the inspection units 510 and 520, i.e., the clearance between the inspection units 510 and 520, the fan filter unit 509 can directly form a downflow of clean air. Consequently, a downflow of clean air can be supplied to the overall indexer ID.

Processing in the substrate processing apparatus having the aforementioned structure is now described. First, the transfer robot TF of the indexer ID takes out an unprocessed substrate W from any carrier C and transfers the same to the transport robot of the unit arrangement part MP. In order to take out the unprocessed substrate W, the transfer robot TF moves toward the front side of the carrier C storing this substrate W and inserts the transfer arm 575 under the substrate W. The transfer robot TF slightly moves up the transfer arm 575 for holding the substrate W, and retracts the transfer arm 575 for taking out the unprocessed substrate W.

The substrate W transferred to the unit arrangement part MP is cyclically transferred by the transport robot between the processing units along a prescribed procedure. More specifically, the substrate processing apparatus applies resist to the substrate W subjected to adhesion enhancement, thereafter prebakes the same and transfers the substrate W formed with a resist film to the stepper through the interface IFB. The substrate W subjected to exposure is returned to the unit arrangement part MP again from the stepper through the interface IFB. The substrate processing apparatus performs post-exposure baking and development on the exposed substrate W. The developed substrate W is further baked and thereafter transferred to the transfer robot TF of the indexer ID from the transport robot of the unit arrangement part MP. The transfer robot TF receiving the processed substrate W stores the substrate W in the carrier C.

While basic processing performed on the substrate W has been briefly described, the substrate processing apparatus according to this preferred embodiment also inspects the substrate W therein. Among the inspections, the resist thickness measurement is preferably performed on the prebaked substrate W before the substrate W is introduced into the stepper. In this case, the substrate processing apparatus temporarily returns the prebaked substrate W from the unit arrangement part MP to the indexer ID, so that the transfer robot TF introduces the substrate W into the inspection unit 520. The transfer robot TF transfers the substrate W completely subjected to resist thickness measurement from the inspection unit 520 to the unit arrangement part MP again, so that the transport robot of the unit arrangement part MP transfers the substrate W to the interface IFB for introducing the substrate into the stepper.

The macro defect inspection, the pattern line width measurement and the pattern superposition measurement are preferably performed on the substrate W completely processed and returned to the indexer ID. The transfer robot TF introduces the substrate W completely processed and returned to the indexer ID into the inspection unit 510, for performing the macro defect inspection. On the other hand, the transfer robot TF introduces the substrate W completely processed and returned to the indexer ID into the inspection unit 520, for performing the pattern line width measurement and the pattern superposition measurement. In either case, the transfer robot TF stores the inspected substrate W from the inspection unit 510 or 520 in the carrier C.

In order to introduce the substrate W to be inspected into the inspection unit 510, the transfer robot TF moves up the transfer arm 575 receiving this substrate W through the clearance between the inspection units 510 and 520 and direct the transfer arm 575 to the inspection unit 510, and thereafter advances the transfer arm 575 for introducing the substrate W through an inlet 511 (see FIG. 12), as shown by the arrow AR2 in FIG. 9. In order to discharge the inspected substrate W from the inspection unit 510, the transfer robot TF performs an operation reverse to the above.

In order to introduce the substrate W to be inspected into the inspection unit 520, the transfer robot TF similarly moves up the transfer arm 575 receiving this substrate W through the clearance between the inspection units 510 and 520 and direct the transfer arm 575 to the inspection unit 520 and thereafter advances the transfer arm 575 for introducing the substrate W from an inlet of the inspection unit 520, as shown by the arrow AR3 in FIG. 9. In order to discharge the inspected substrate W from the inspection unit 520, the transfer robot TF performs an operation reverse to the above.

In the substrate processing apparatus according to this preferred embodiment, as hereinabove described, the indexer ID completely includes the inspection units 510 and 520 therein, whereby no footprint for an inspection apparatus is required and the overall footprint of the substrate processing apparatus is not increased.

The plane area of the indexer ID completely includes or encloses those of the inspection units 510 and 520 therein, whereby the shape of the substrate processing apparatus can be simplified so that a number of substrate processing apparatuses can be efficiently arranged in the clean room. Therefore, increase of the running cost resulting from increase of the footprint or a dead space can be suppressed.

The substrate processing apparatus comprises the inspection units 510 and 520 therein, whereby the time required for completing the inspections can be reduced and the results of the inspections can be quickly fed back to the unit arrangement part MP. When a defective substrate is caused due to improper processing conditions, therefore, the number of substrates processed under the improper processing conditions before the defect is proven by the inspections can be minimized.

Further, the inspection units 510 and 520 are arranged within the indexer ID, whereby the indexer ID may be used for introducing or discharging the substrate W into or from the inspection units 510 and 520.

The clean air outlets 507 are provided under the inspection units 510 and 520 respectively and communicatively connected with the fan filter unit 509 by the ducts 506, whereby downflows of clean air can be formed also under the inspection units 510 and 520.

In place of the structure of the preferred embodiments, only a single inspection unit or two or more inspection units may be provided in the indexer ID. Each inspection unit may be any of a thickness measuring unit measuring the thickness of a resist film, a line width measuring unit measuring the line width of a pattern, a superposition measuring unit measuring superposition of the pattern and a macro defect inspection unit.

Figure 13:
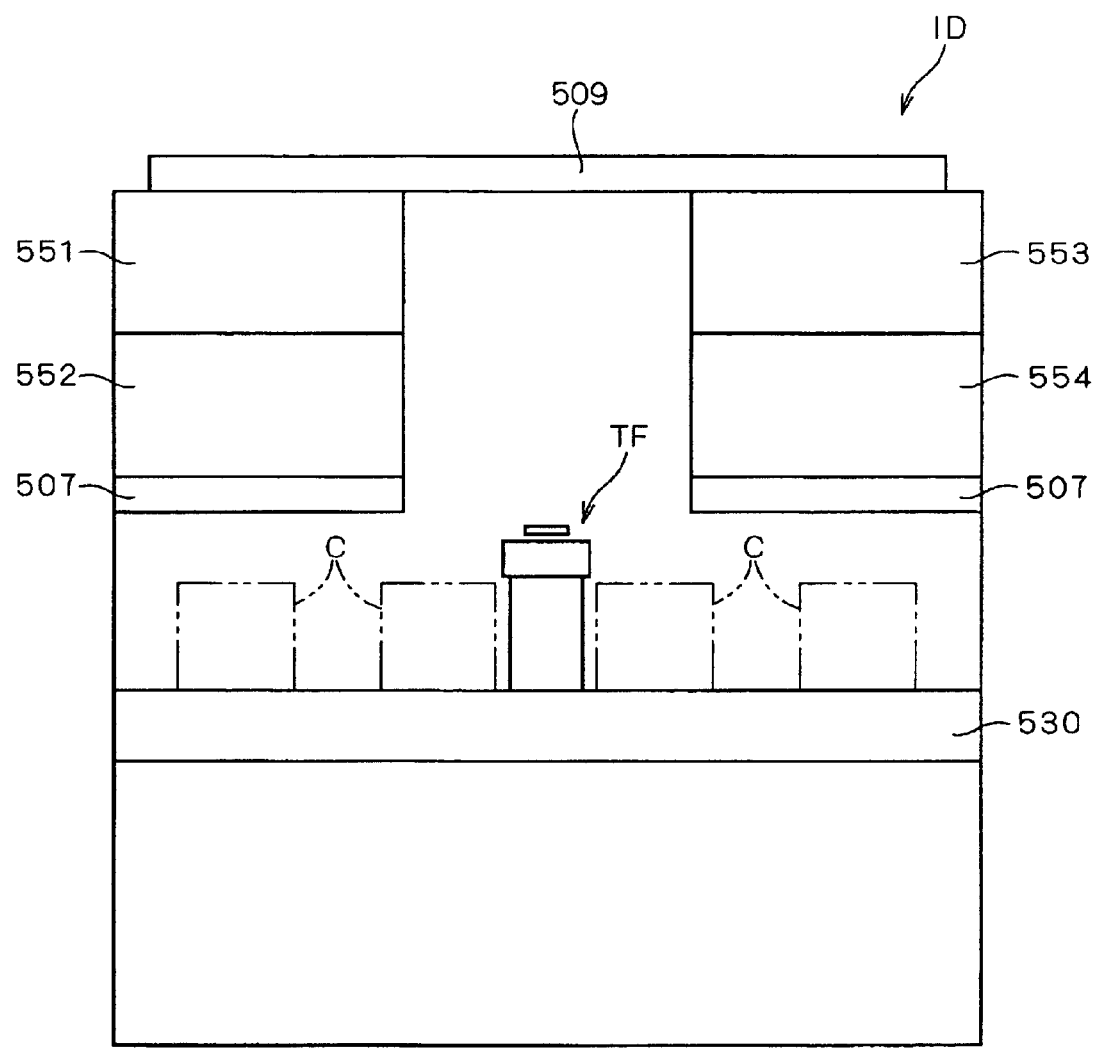
FIG. 13 illustrates four exemplary inspection units arranged in an indexer.
Figure 13:
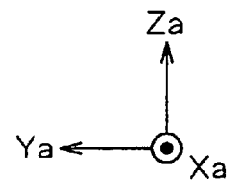

FIG. 13 illustrates four exemplary inspection units 551, 552, 553 and 554 arranged in an indexer ID. The inspection unit 551 is a macro defect inspection unit performing a macro defect inspection, the inspection unit 552 is a thickness measuring unit measuring the thickness of a resist film, the inspection unit 553 is a line width measuring unit measuring the line width of a pattern, and the inspection unit 554 is a superposition measuring unit measuring superposition of the pattern.

Referring to FIG. 13, the inspection units 551, 552, 553 and 554 are so arranged that an indexer plane area formed by parallel projection mapping of the indexer ID onto a horizontal plane includes inspection part plane areas formed by parallel projection mapping of the inspection units 551, 552, 553 and 554 onto the horizontal plane. The remaining points such as clean air outlets 507 communicatively connected with a fan filter unit 509 are identical to those of the aforementioned preferred embodiment.

Also in this case, the indexer ID completely includes the inspection units 551, 552, 553 and 554 therein, whereby no footprint for an inspection apparatus is required and the overall footprint of the substrate processing apparatus is not increased.

The inspection unit 520 may alternatively perform only a single inspection. Further, the inspection units 510 and 520 may alternatively be vertically stacked on an upper corner of the indexer ID. Also in this case, the indexer plane area formed by parallel projection mapping of the indexer ID onto a horizontal plane includes an inspection part plane area formed by parallel projection mapping of the inspection units 510 and 520 onto the horizontal plane.

In other words, it is possible to implement a substrate processing apparatus having a function capable of inspecting substrates without increasing the footprint similarly to the aforementioned preferred embodiment by arranging a single or a plurality of inspection units performing at least one of thickness measurement measuring the thickness of a resist film, line width measurement measuring the line width of a pattern, superposition measurement measuring superposition of the pattern and a macro defect inspection in the indexer ID so that the indexer plane area formed by parallel projection mapping of the indexer ID onto a horizontal plane includes inspection part plane area(s) formed by parallel projection mapping of the inspection unit(s) onto the horizontal plane.

Figure 14:
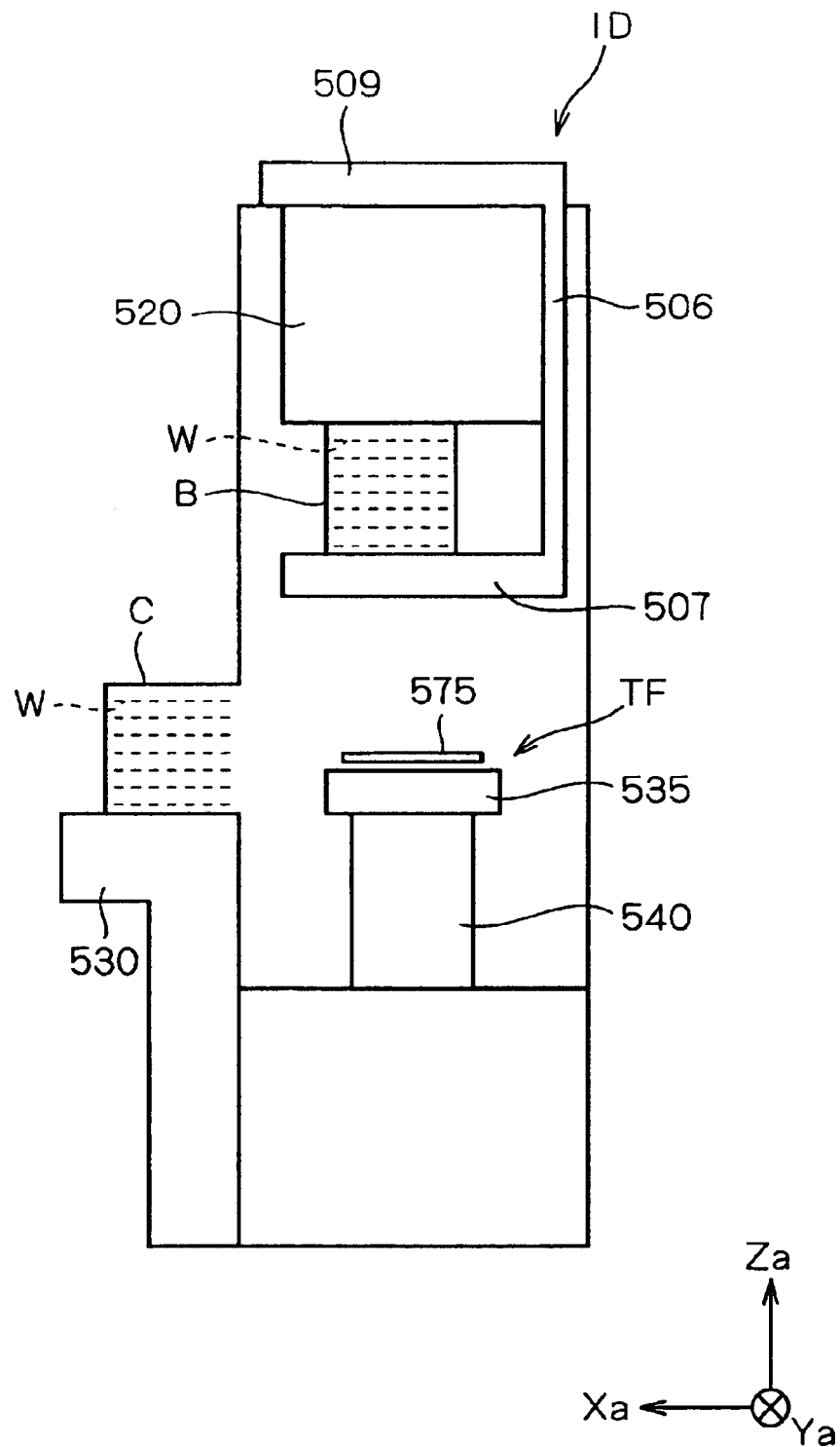
FIG. 14 illustrates an exemplary buffer cassette arranged on an indexer.

When the processing times of the inspection units 510 and 520 and the unit arrangement part MP are different from each other, buffer cassettes may be provided. FIG. 14 illustrates an exemplary buffer cassette B arranged in the indexer ID. The buffer cassette B is arranged under each of the inspection units 510 and 520. The structure of the buffer cassette B can be selected from various types similarly to the carrier C, so far as the same can store substrates W in a multistage manner. When the processing times of the inspection units 510 and 520 and the unit arrangement part MP are different from each other, e.g., the processing time in the inspection unit 520 is longer, processing delay in the unit arrangement part MP resulting from the difference between the processing times can be prevented by temporarily storing the substrate W to be inspected in the buffer cassette B. The dedicated buffer cassette B may not be provided but any carrier C placed on the receiving stage 530 may alternatively be employed as the buffer cassette.

While the transfer robot TF of the indexer ID comprises the single transfer arm 575 in the aforementioned embodiment (see FIG. 11), the transfer robot TF may alternatively comprise two transfer arms in the so-called double-arm type. When the indexer ID comprises inspection units, the access frequency of the transfer robot TF is increased as compared with the prior art as the matter of course, and hence the transportation efficiency for the substrates W as well as the throughput of the substrate processing apparatus are improved when the transfer robot TF comprises two transfer arms.

The technique according to the present invention is not restricted to the case where the substrate processing apparatus performs resist application and development on the substrates W while the inspection units 510 and 520 perform inspections related to the so-called photolithography. For example, an inspection unit having an inspection function of measuring amine or ammonia concentration may be employed. A substrate processing apparatus (the so-called spin scrubber or the like) removing particles or the like adhering to substrates, an inspection unit performing a particle inspection may be arranged on an indexer thereof. In an apparatus applying SOD (spin-on-dielectronics) to substrates for forming interlayer isolation films, an inspection unit inspecting baked states of the interlayer isolation films may be arranged on an indexer thereof. Further, inspection units may be arranged on an indexer of a substrate processing apparatus receiving substrates processed in another substrate processing apparatus, inspecting the substrates and thereafter feed-forwarding the results of the inspections to processing conditions. In any case, it is possible to implement a substrate processing apparatus having a function capable of inspecting substrates without increasing the footprint similarly to the aforementioned embodiment so far as an indexer plane area formed by parallel projection mapping of the indexer onto a horizontal plane includes inspection part plane areas formed by parallel projection mapping of the inspection units onto the horizontal plane.

According to the present invention as described in detail with reference to FIGS. 8–14, the following advantages are obtained:

(1) The inspection part performing the prescribed inspection on the substrate is arranged on the indexer part, whereby the inspection part does not project from the substrate processing apparatus but the substrate processing apparatus can be provided with a function capable of inspecting the substrate without increasing the footprint.

(2) The indexer plane area formed by parallel projection mapping of the indexer part onto a horizontal plane includes the inspection part plane area formed by parallel projection mapping of the inspection part on the horizontal plane, whereby the advantage (1) can be reliably attained.

(3) The inspection part is provided on the position not interfering with the moving path where the transport means moves for transferring/receiving the substrate to/from the carrier and unit arrangement part, whereby the inspection part can be prevented from inhibiting substrate transportation by the transport means.

(4) The inspection part is provided on the position higher than the arrangement of the plurality of carriers, whereby the advantage (3) can be more reliably obtained.

(5) The inspection part includes any of the thickness measuring unit measuring the thickness of the resist film, the line width measuring unit measuring the line width of the pattern, the superposition measuring unit measuring superposition of the pattern and the macro defect inspection unit, whereby the substrate processing apparatus can be provided with a function of performing an inspection related to photolithography.

(6) Each of the plurality of inspection units is any of the thickness measuring unit measuring the thickness of the resist film, the line width measuring unit measuring the line width of the pattern, the superposition measuring unit measuring superposition of the pattern and the macro defect inspection unit, whereby the substrate processing apparatus can be provided with a function of performing a plurality of inspections related to photolithography.

(7) The first inspection unit performs measurement of the thickness of the resist film, measurement of the line width of the pattern and measurement of superposition of the pattern and the second inspection unit performs the macro defect inspection, whereby the substrate processing apparatus can be provided with a function of performing four inspections related to photolithography.

While the invention has been shown and described in detail, the foregoing description is in all aspects illustrative and not restrictive. It is therefore understood that numerous modifications and variations can be devised without departing from the scope of the invention.

What is claimed is:

1. An apparatus for processing a substrate, comprising:
a) an indexer portion comprising
a downside structure comprising a transfer robot for transferring a substrate from/to a carrier capable to hold a plurality of substrates, and
an upside structure defined above said downside structure and comprising an inspection section operable to inspect said substrate; and
b) a processing portion comprising
an arrangement of processing units for applying a series of processing to said substrate transferred from said transfer robot, and
a transport robot for transporting said substrate between said arrangement of processing units, wherein
a plane area of said upside structure projected onto a horizontal plane is included in a plane area of said downside structure projected onto said horizontal plan, and wherein
said upside structure is provided in a location out of a range in which said transfer robot moves for transferring substrate between said carrier and said processing portion; and
said transfer robot comprises:
a transfer arm for holding said substrate, and
a telescopic multistage structure on which said transfer arm is provided, said telescopic multistage structure being operable to expand and contract whereby said transfer arm is capable of accessing said carrier and said inspection section.

2. The apparatus in accordance with claim 1, wherein
said inspection section comprises a plurality of inspection units horizontally separated with each other across a gap space, and
said transfer robot is operable to access to each inspection unit from said gap space.

3. The apparatus in accordance with claim 1, wherein
said inspection section includes at least one of:
a resist thickness measurement unit for measuring thickness of resist formed on said substrate;
a pattern line width measurement unit for measuring line width of lines forms on said substrate;
a pattern superposition measurement for measuring superposition of circuit patterns formed on said substrate; and
a macro defect inspection for detecting macro defect on said substrate.

4. The apparatus in accordance with claim 1, wherein
said inspection section includes
a complex inspection unit for measuring thickness of resist formed on said substrate, line width of lines formed on said substrate, and for measuring superposition of circuit patterns formed on said substrate, and
a macro defect inspection unit for detecting macro defect on said substrate.

5. An apparatus for processing a substrate, comprising:
a) an indexer portion comprising
a downside structure comprising a transfer robot for transferring a substrate from/to a carrier capable to hold a plurality of substrates, and
an upside structure defined above said downside structure and comprising an inspection section operable to inspect said substrate; and
b) a processing portion comprising
an arrangement of processing units for applying a series of processing to said substrate transferred from said transfer robot, and
a transport robot for transporting said substrate between said arrangement of processing units, wherein a plane area of said upside structure projected onto a horizontal plane is included in a plane area of said downside structure projected onto said horizontal plane, and wherein said downside structure comprises a carrier stage on which a plurality of carriers each containing a plurality of substrates are aligned, and said upside structure is provided over an alignment of said plurality of substrates; and said transfer robot comprises:

a transfer arm for holding said substrate, and a telescopic multistage structure on which said transfer arm is provided, said telescopic multistage structure being operable to expand and contract whereby said transfer arm is capable of accessing said carrier and said inspection section.

6. The apparatus in accordance with claim 5, wherein said inspection section comprises a plurality of inspection units horizontally separated with each other across a gap space, and said transfer robot is operable to access each inspection unit from said gap space.

7. The apparatus in accordance with claim 5, wherein said inspection section includes at least one of:

a resist thickness measurement unit for measuring thickness of resist formed on said substrate;

a pattern line width measurement unit for measuring line width of lines forms on said substrate;

a pattern superposition measurement for measuring superposition of circuit patterns formed on said substrate; and a macro defect inspection for detecting macro defect on said substrate.

8. The apparatus in accordance with claim 5, wherein said inspection section includes a complex inspection unit for measuring thickness of resist formed on said substrate, line width of lines formed on said substrate, and for measuring superposition of circuit patterns formed on said substrate, and a macro defect inspection unit for detecting macro defect on said substrate.

9. An apparatus for processing a substrate, comprising:

a) an indexer portion comprising a downside structure comprising a transfer robot for transferring a substrate from/to a carrier capable to hold a plurality of substrates, and an upside structure defined above said downside structure and comprising an inspection section operable to inspect said substrate; and b) a processing portion comprising an arrangement of processing units for applying a series of processing to said substrate transferred from said transfer robot, and a transport robot for transporting said substrate between said arrangement of processing units, wherein a plane area of said upside structure projected onto a horizontal plane is included in a plane area of said downside structure projected onto said horizontal plane, and wherein a clean air product is provided under said inspection section to supply clean air to said downside structure; and said transfer robot comprises:

a transfer arm for holding said substrate, and a telescopic multistage structure on which said transfer arm is provided, said telescopic multistage structure being operable to expand and contract whereby said transfer arm is capable of accessing said carrier and said inspection section.

10. The apparatus in accordance with claim 9, wherein said inspection section comprises a plurality of inspection units horizontally separated with each other across a gap space, and said transfer robot is operable to access each inspection unit from said gap space.

11. The apparatus in accordance with claim 9, wherein said inspection section includes at least one of:

a resist thickness measurement unit for measuring thickness of resist formed on said substrate;

a pattern line width measurement unit for measuring line width of lines forms on said substrate;

a pattern superposition measurement for measuring superposition of circuit patterns formed on said substrate; and a macro defect inspection for detecting macro defect on said substrate.

12. The apparatus in accordance with claim 9, wherein said inspection section includes a complex inspection unit for measuring thickness of resist formed on said substrate, line width of lines formed on said substrate, and for measuring superposition of circuit patterns formed on said substrate, and a macro defect inspection unit for detecting macro defect on said substrate.

13. The apparatus in accordance with claim 1, wherein said inspection section comprises an inspection unit provided on an upper corner of said indexer.

14. The apparatus in accordance with claim 5, wherein said inspection section comprises an inspection unit provided on an upper corner of said indexer.

15. The apparatus in accordance with claim 9, wherein said inspection section comprises an inspection unit provided on an upper corner of said indexer.

* * * * *